United States Patent

Driver et al.

[15] 3,675,313

[45] July 11, 1972

[54] PROCESS FOR PRODUCING SELF ALIGNED GATE FIELD EFFECT TRANSISTOR

[72] Inventors: Michael C. Driver, Trafford; Martin J. Geisler, Murrysville, both of Pa.

[73] Assignee: Westinghouse Electric Corporation, Pittsburgh, Pa.

[22] Filed: Oct. 1, 1970

[21] Appl. No.: 77,117

[52] U.S. Cl. ....................29/571, 29/578, 148/175, 148/187

[51] Int. Cl. ....................B01j 17/00, H01g 13/00

[58] Field of Search ....................29/571, 578; 117/212; 317/235 A

[56] References Cited

UNITED STATES PATENTS

| | | | |
|---|---|---|---|
| 3,193,418 | 7/1965 | Cooper et al. | 148/189 |
| 3,519,504 | 7/1970 | Cuomo | 148/187 |
| 3,551,220 | 12/1970 | Meer et al. | 148/175 |

*Primary Examiner*—John F. Campbell
*Assistant Examiner*—W. Tupman
*Attorney*—F. Shapoe and C. L. Menzemer

[57] ABSTRACT

This disclosure relates to a process for preparing a self-aligned gate field effect transistor in which the source-drain spacing is automatically held to a minimum as a result of the processing steps.

6 Claims, 7 Drawing Figures

PROCESS FOR PRODUCING SELF ALIGNED GATE FIELD EFFECT TRANSISTOR

BACKGROUND OF THE INVENTION

1. Field of the Invention

This invention is in the field of semiconductor devices and more particularly is directed to a process for preparing a field effect transistor.

2. Prior Art

Prior art devices are usually made employing diffusion through two or more photoresist masks. The positioning and alignment of the masks makes it difficult to have the gate contact positioned equaldistant between the source and drain contacts.

SUMMARY OF THE INVENTION

In accordance with the present invention there is provided a process for preparing a semiconductor device comprising:

1. growing a first epitaxial *n*-type layer of a semiconductor material on a surface of a high resistivity p-type substrate of the same semiconductor material,
2. growing a second epitaxial layer over said first epitaxial layer, said second epitaxial layer being more heavily doped than said first epitaxial layer,
3. forming a layer of silicon nitride over said second epitaxial layer,
4. etching an aperture entirely through said silicon nitride and said second epitaxial layer and into a portion of said first epitaxial layer, said aperture formed by said walls of the first epitaxial layer, the second epitaxial layer and the layer of silicon nitride being of a greater cross-sectional area in said second epitaxial layer than in said silicon nitride layer, said aperture being of a lesser cross-sectional area than the surface of the *p*-type substrate and the layers successively grown thereon, a portion of said first epitaxial layer forming a bottom surface of the aperture,
5. forming a silicon oxide layer on the silicon nitride layer and over the side walls and bottom surface of the aperture,
6. depositing a gold layer on the silicon oxide layer over the silicon nitride and on the bottom surface of the aperture in a pattern corresponding to a vertical projection of the aperture through the silicon nitride layer plus a small peripheral increment,
7. etching away the silicon oxide layer not covered by the gold layer,
8. etching away the gold layer thereby exposing the silicon oxide layer,
9. diffusing an *n*-type dopant into that portion of the side walls of the aperture not covered by the oxide,
10. removing the remaining silicon oxide layer,
11. etching contact apertures for electric of contacts through the nitride layer, said apertures extending to the second epitaxial layer,
12. depositing metal electrical contacts onto said second epitaxial layer through said contact apertures, and
13. depositing a metal electrical gate contact onto the bottom surface of said aperture, said metal electrical gate contact being a vertical projection of the aperture through said silicon nitride layer.

DESCRIPTION OF PREFERRED EMBODIMENT

The present invention will be described in terms of a silicon field effect transistor. It should be understood however, that a device can be prepared in accordance with the teachings of this invention employing any semiconductor material such for example germanium, Group III- Group V compounds, Group II-Group VI compounds and silicon carbide.

Figure 1:
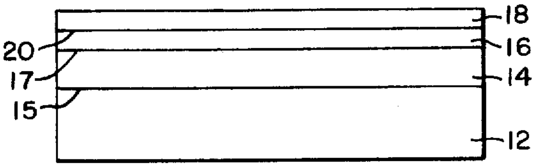
FIGS. 1 to 3 are side views of a body of semiconductor material being processed in accordance with the teachings of this invention.

With reference to FIG. 1, there is shown a structure 10 suitable for use in preparing a field effect transistor in accordance with the teachings of this invention.

The structure 10 consists of substrate 12 of *p*-type silicon. The substrate 12 should have a thickness sufficient to permit manual and mechanical handling during processing. A thickness of from about 2 to 4 mils have been found satisfactory. The substrate 12 should have a resistivity of at least 50 ohm-cm so that there is essentially no electrical conduction through the substrate during operation of the device.

There is a first epitaxial layer 14 grown on top surface 15 of substrate 12. The first epitaxial layer 14 is opposite in semiconductivity type to the substrate 12, in this case layer 14 is *n*-type, has a thickness of from 4 to 5 microns and is doped to a concentration of from $10^{14}$ to $10^{16}$ atoms of dopant per cubic centimeter of silicon.

There is a second epitaxial layer 16 grown on top surface 17 of the first epitaxial layer 14. The second epitaxial layer 16 is of the same type of semiconductivity of the first layer 14, in this case *n*-type, but doped to a higher concentration than first layer 14. Layer 16 is doped to a concentration of from $10^{17}$ to $10^{22}$ atoms of dopant per cubic centimeter of silicon. Layer 16 has a thickness of from 2 to 4 microns.

The first and second epitaxial layers, 14 and 16 respectively, may be grown by any of the processes known to those skilled in the art.

The doping concentration and thickness of the first epitaxial layer 14 determines the gate pinch-off voltage of the final device. The thinner the layer and the lower the doping concentration, the lower the pinch-off voltage.

The crystalline structure at the interface between the first epitaxial layer 14 and the substrate 12 must be matched as closely as possible to prevent any reduction in carrier mobility in the channel. Reduction in carrier mobility reduces the frequency at which the device will operate.

There is a layer 18 of silicon nitride deposited or formed by sputtering or by pyrolytic techniques on surface 20 of second layer 16. The layer 18 of silicon nitride should be thick enough to be rigid but thin enough to allow good resolution of a preselected pattern to be etched therethrough. A thickness of from 500 A to 2,000 A has been found satisfactory.

Figure 2:
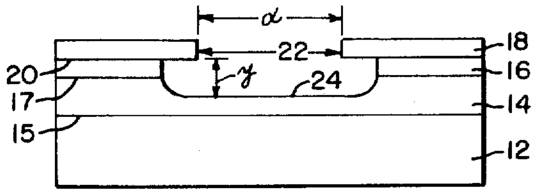

With reference to FIG. 2, a pattern for an aperture 22 is formed in layer 18 of silicon nitride and the aperture 22 is formed by etching. The aperture 22 extends entirely through the silicon nitride layer 18 and the second epitaxial layer 16 and terminates at a bottom surface 24 in first epitaxial layer 14. The depth of the aperture 22 is not critical as long as it terminates somewhere within layer 14 short of surface 15 and exposes surface 17 which is the interface between layers 14 and 16.

The width of aperture 22 in nitride layer 18, denoted as $x$ in FIG. 2, is equal to the desired channel length in the finished device. Usually $x$ will be from 1 to 5 microns.

The degree of undercutting which normally takes place in layers 14 and 16 is not critical as will be explained below.

A suitable etchant for forming aperture 22 is phosphoric acid at a temperature of about 200° C.

Figure 3:
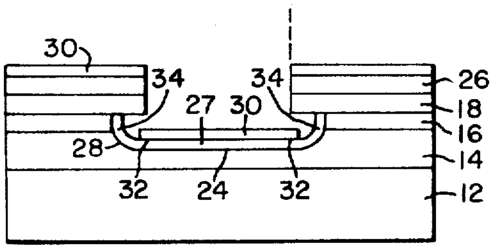

With reference to FIG. 3, a layer 26 of silicon oxide is deposited over the silicon nitride layer 18 and a layer 27 of silicon oxide is deposited over side walls 28 and bottom 24 of the aperture 22.

The oxide layers 26 and 27 may be formed by thermal method, pryolytic methods or by sputtering. These methods are well known to those skilled in the art.

The thickness of the oxide layers is not critical and thicknesses of from 0.5 to 1 micron have been found satisfactory.

Next, a layer 30 of gold having a thickness of from 500 A to 2,000 A is deposited over the oxide layer 26 and over a portion of the oxide layer 27.

The gold layer 30 is deposited on layer 27 in a pattern corresponding to a vertical projection of the aperture 22 through the silicon nitride layer 18, this is denoted by dotted lines in FIG. 3, plus a small peripheral increment 32. The increment 32 is equal to the desired spacing between the gate-source and gate-drain in the final device. The increment 32 usually ranges up to 0.1 microns.

The source-drain spacing in the final device will be equal to the diameter $x$ of the aperture 22 plus twice increment 32.

Figure 4:
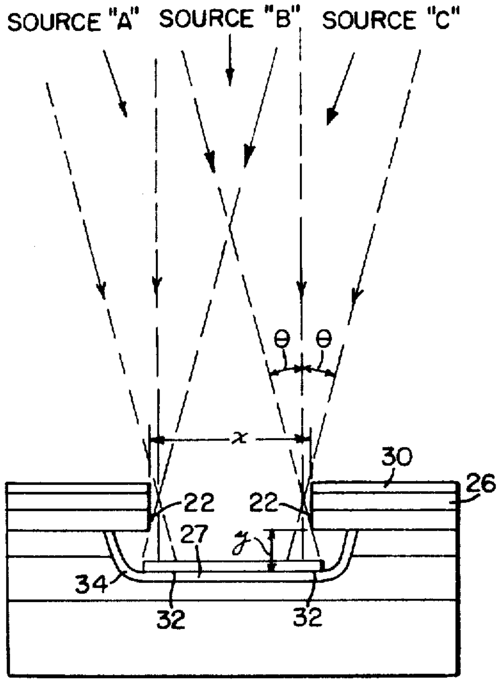
FIG. 4 is a schematic diagram showing the angle at which gold is deposited on the bottom of the aperture and its relationship to source-drain spacing.

With reference to FIG. 4, the gold layer 30 is deposited on layer 26 and on that portion of layer 27 which corresponds to the vertical projection of the aperture 22 from a source denoted 34 which is positioned perpendicular to layer 26.

The gold layer 30 is deposited on increment 32 from sources 36 and 38 which are off-set from the perpendicular by an angle theta ($\theta$). The increment 32 being equal to $y$ (tangent $\theta$) where y is the distance from the surface 22 to the bottom surface 24 of aperture 22.

Figure 5:
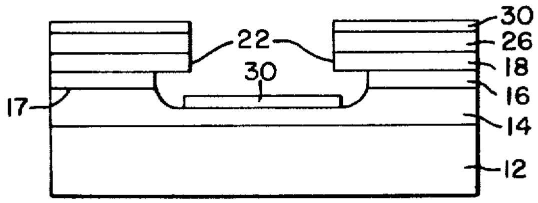

With additional reference to FIG. 5, employing gold layer 30 as a mask, that portion 34 of the oxide layer 28 disposed within aperture 22 not masked by gold layer 30 is etched away employing any suitable oxide etchant. This exposes the interface 17 between the first epitaxial layer 14 and the second epitaxial layer 16 along the side walls of the aperture 22.

The gold layers 30 and 32 are then removed by etching with any suitable etchant exposing the silicon oxide layers 26 and 27.

Figure 6:
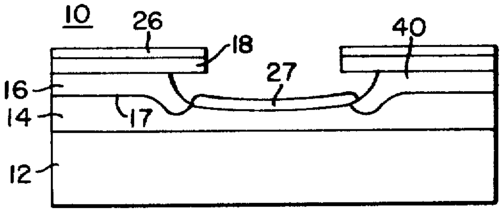
FIGS. 5 and 6 are side views of the body of semiconductor material undergoing further processing in accordance with the teachings of this invention.

With reference to FIG. 6, employing oxide layer 27 as a mask a suitable $n$-type dopant is diffused into that portion of layers 14 and 16 exposed along the side walls of aperture 22 forming a region 40 of $n+$ type semiconductivity. Region 40 serves as source and drain for the final device. Following the diffusion and formation of region 40, the oxide layers 26 and 27 are removed.

Figure 7:
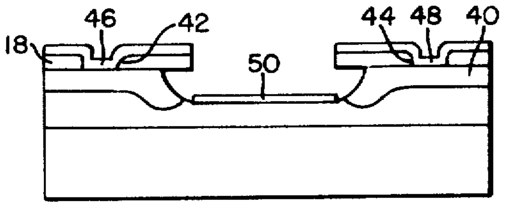
FIG. 7 is a side view of a semiconductor device prepared in accordance with the teachings of this invention.

With reference to FIG. 7, apertures 42 and 44 are etched entirely through the silicon nitride layer 18 to region 40 and electrical source contact 46 and electrical drain contact 48 are deposited in the apertures 42 and 44 respectively and allowed to extend over the silicon nitride layer 18 adjacent the apertures to facilitate making electrical contact thereto.

A gate electrical contact 50 is deposited on bottom surface 24 of aperture 22 and is a vertical projection of aperture 22 through the nitride layer 18.

The source and drain electrical contacts may consist of any suitable metal as for example gold, chromium, lead, molybdenum, tungsten and tantalum.

The gate contact may consist of any suitable metal such as for example aluminum, copper, tin, silver, gold and platinum and should have a thickness of from about 300 A to 1,000 A.

The structure of FIG. 7 is a field effect transistor.

We claim as our invention:

1. A process for preparing a semiconductor device comprising:

1 ) growing a first epitaxial layer of a semiconductor material having a first-type of semiconductivity upon a substrate of the same semiconductive material but having a second-type of semiconductivity, 2. growing a second epitaxial layer of the semiconductor material over said first epitaxial layer, said second epitaxial layer being of the same type of semiconductivity as said first epitaxial layer but being more heavily doped than said first layer, 3. forming a layer of silicon nitride over said second epitaxial layer, 4. etching an aperture entirely through said layer of silicon nitride and said second epitaxial layer and into a portion of said first epitaxial layer, said aperture being of a greater cross-sectional area in said second epitaxial layer than in said silicon nitride layer , 5. forming a silicon oxide layer on the silicon nitride layer and over the side walls and bottom of the aperture, 6. depositing a gold layer over the silicon oxide layer disposed over the silicon nitride layer and on the bottom surface of the aperture, the pattern of the gold layer on the bottom surface of the aperture corresponding to a vertical projection of the aperture through the silicon nitride layer plus a small peripheral increment, 7. etching away that portion of the silicon oxide layer not covered by the gold layer, 8. etching away the gold layer thereby exposing the silicon oxide layer, 9. diffusing a dopant capable of imparting said first-type of semiconductivity into that portion of the side walls of the aperture not covered by the oxide layer, 10. removing the remaining silicon oxide layer, 11. etching contact apertures for electrical contacts through the nitride layer, said apertures extending to the second epitaxial layer, 12. depositing metal electrical contacts onto said second epitaxial layer through said contact apertures, and 13. depositing a metal electrical gate contact onto the bottom surface of said aperture, said metal electrical gate contact being a vertical projection of the aperture through said silicon nitride layer.

2. The process of claim 1 in which the gold layer deposited over the silicon oxide layer is deposited from a plurality of sources, at least one of said sources being perpendicular to the top surface of the structure and at least one other source being disposed at an angle off the perpendicular.

3. The process of claim 1 in which the aperture etched through the silicon nitride layer has a diameter as measured in the silicon nitride layer equal to the desired channel length in the completed device.

4. The process of claim 1 in which the small peripheral increment by which the gold layer deposited on the bottom surface of the aperture exceeds the vertical projection of the aperture through the silicon nitride layer is equal to the desired gate-source and gate-drain spacing in the completed device.

5. The process of claim 2 in which the said at least one other source is disposed at an angle from the perpendicular that is dependent upon the desired gate-source and gate-drain spacing in the completed device.

6. The process of claim 1 in which the first and second epitaxial layers are grown having an $n$-type semiconductivity.

* * * * *